(12) United States Patent
Boskovic

(10) Patent No.: US 7,761,725 B2
(45) Date of Patent: Jul. 20, 2010

(54) CLOCK GENERATION FOR SYNCHRONOUS CIRCUITS WITH SLOW SETTLING CONTROL SIGNALS

(75) Inventor: Boris Boskovic, Toronto (CA)

(73) Assignee: ATI Technologies ULC, Markham, Ontario (CA)

( * ) Notice: Subject to any disclaimer, the term of this patent is extended or adjusted under 35 U.S.C. 154(b) by 764 days.

(21) Appl. No.: 11/468,633

(22) Filed: Aug. 30, 2006

(65) Prior Publication Data

US 2008/0059829 A1  Mar. 6, 2008

(51) Int. Cl.
*G06F 1/00* (2006.01)

(52) U.S. Cl. .................. 713/322; 713/500; 713/600

(58) Field of Classification Search ............ 713/500, 713/322, 600
See application file for complete search history.

(56) References Cited

U.S. PATENT DOCUMENTS

| | | | |
|---|---|---|---|
| 6,182,234 B1 * | 1/2001 | Toda | 713/501 |
| 6,535,798 B1 * | 3/2003 | Bhatia et al. | 700/293 |
| 6,874,097 B1 * | 3/2005 | Aliahmad et al. | 713/401 |
| 2003/0014620 A1 * | 1/2003 | Hanjani | 713/1 |
| 2007/0028031 A1 * | 2/2007 | Peterson et al. | 711/103 |

* cited by examiner

*Primary Examiner*—Chun Cao
(74) *Attorney, Agent, or Firm*—Vedder Price P.C.

(57) ABSTRACT

A circuit includes a clock generator for providing a clock signal to a synchronously operated digital circuit and a control signal generator for providing a control signal to the synchronously operated digital circuit. The control signal generator is interconnected to the clock generator to suppress the clock signal for a defined duration as a control signal is provided. The defined duration allows the control signal to settle to allow said synchronously operated digital circuit to unambiguously sample said control signal. The control signal generator may place the synchronous digital circuit in a lower power consumption state.

24 Claims, 9 Drawing Sheets

CLOCK GENERATION FOR SYNCHRONOUS CIRCUITS WITH SLOW SETTLING CONTROL SIGNALS

FIELD OF THE INVENTION

The present invention relates generally to synchronous circuits, and more particularly to synchronous circuits in which control signals do not settle within one clock cycle, and methods and controllers for unambiguously sampling such control signals.

BACKGROUND OF THE INVENTION

High speed synchronous circuits in which a controller drives multiple loads are known. Typical examples include synchronous dynamic random access memory (SDRAM) circuits with multiple memory ranks. In synchronous circuits, a controller typically provides a common clock used to provide a common timing reference.

As clock rates used in these circuits are very high, signals on some signal lines drive multiple modules may not settle to be reliably sampled within one clock cycle. Thus, designs that take this into account usually allow slow settling signals connected to multiple modules to settle in two or three clock cycles. Such timing arrangements, in which signals are not sampled within the same clock cycle in which they are produced, but in the subsequent second or third clock cycle, are sometimes called 2T or 3T timing respectively. Signals that are required to settle in a single clock cycle may be said to meet 1T timing.

Signals that drive multiple loads may often need to settle before the next rising or falling edge of a clock that is used by a receiving device or subsystem for sampling the signal. That is, they must meet 1T timing. This can be observed for instance, in SDRAM which are double data rate (DDR). DDR memory modules have become very common as they offer higher bandwidth than their single data rate (SDR) counterparts, by reading and/or writing data during both the rising and falling edges of the clock. In DDR SDRAM interface circuits, some control signals such as clock-enable and chip-select signals must always be in 1T timing mode. Data in DDR SDRAM circuits is transferred at double the clock rate. Data lines are sampled with a strobe at both rising and falling edges so data signals must settle within half clock (strobe) period.

Such design constraints in high speed interface circuits, in which signal lines interconnect many modules, are often difficult to meet. The time it takes for the signal level on a line to transition to logic high or logic low level depends in part on the electrical load connected to the line. Stringent timing constraints are particularly difficult to meet on a signal line that is interconnected to multiple modules, as the trace characteristic impedance connecting the multiple modules, and the capacitive load of the multiple modules may not permit fast settling of the signal to a desired signal level. If timing requirements are not met, signals may be ambiguously or inaccurately decoded.

Consequently, to ensure timing requirements are met, high speed interface circuits driving multiple loads typically use separate signal lines to each of the modules, for signals that should meet 1T timing. With separate signal lines, the load on each line is reduced to just one module (load), and thus stricter timing requirements can be met.

Unfortunately, providing multiple drivers and routing multiple individual lines connected to individual modules, rather than sharing the same signal line is often complex and expensive. When such circuits are part of an integrated circuit (IC), the size of the die on which the IC may be formed is increased, as a result of the increased signal lines interconnecting the various modules to the controller.

In cases where the controller is a discrete component separate from the loads, its input-output ring or pin count would increase as more connections are needed. All these factors increase the cost of manufacturing the circuit.

Clearly, an improved controller for use in synchronous circuits and methods to provide shared signals is desirable.

SUMMARY OF THE INVENTION

In accordance with one aspect of the present invention, there is provided, a method of operating a synchronous digital circuit including a clock input and at least one control signal input. The digital circuit has a normal state and a lower power consumption state. The method involves providing a clock signal through the clock input providing a control signal through the control signal input to place the synchronous digital circuit in a lower power consumption state. The control signal takes longer than one cycle of the clock signal to settle. The method involves concurrently suppressing the clock signal at the clock input for at least the duration time that the control signal needs to settle. This prevents sampling of the control signal before it has settled.

In accordance with another aspect of the present invention, there is provided, a circuit including a clock generator for providing a clock signal to a synchronously operated digital circuit; and a control signal generator for providing a control signal to the synchronously operated digital circuit. The control signal generator interconnected to the clock generator and suppresses the clock signal for a defined duration as a control signal is provided by the control signal generator. The defined duration allows the control signal to settle, which in turn allows the synchronously operated digital circuit to unambiguously sample the control signal.

In accordance with another aspect of the present invention, there is provided, a memory circuit, including a plurality of ranks of synchronous memory, each of the ranks having a first control signal input and a clock input; a controller including a control signal generator providing a shared signal to the first control signal inputs of the of ranks, and a clock generator providing a clock to the clock inputs of the ranks. The control signal generator is in communication with the clock generator to suppress the clock for a defined duration as a control signal is provided by the control signal generator. The defined duration allows the control signal to settle to allow each of the ranks of synchronous memory to unambiguously sample the control signal.

In accordance with another aspect of the present invention, there is provided, a clock generator including a multiplexer in electrical communication with a first clock input for accepting a first external clock signal of period T, a second clock input for accepting a second external clock signal of period T/2, a first signal input accepting a first signal, a second signal input accepting a second signal, and an output providing an output clock signal. The multiplexer interleaves the first and second signals at a rate of about 2/T to generate the output clock signal, such that for every consecutive duration of length T, the output transmits the first signal for a portion the duration, and the second signal for the remainder of the duration.

In accordance with another aspect of the present invention, there is provided, a method of operating a synchronous digital circuit including a clock input and at least one control signal input. The digital circuit has a normal state and a lower power consumption state. The method includes receiving a clock signal through the clock input in the normal state, and receiving a control signal through at least one control signal input to place the synchronous digital circuit in a lower power consumption state. The control signal takes a duration of longer than one cycle of the clock signal to settle. The synchronous digital circuit samples the control signal only after the duration need by the control signal to settle.

In accordance with another aspect of the present invention, there is provided, a memory controller including a control signal generator that provides a shared signal to a plurality of ranks of synchronous memory. Each of the ranks has a first control signal input and a clock input. The clock generator provides a clock to the clock inputs of the ranks. The control signal generator communicates with the clock generator to suppress the clock for a defined duration as a control signal is provided by the control signal generator. The defined duration allows the control signal to settle, which allow each ranks to unambiguously sample the control signal.

In accordance with another aspect of the present invention, there is provided, a memory circuit having a normal state and a lower power consumption state. The memory circuit includes a plurality of ranks of synchronous memory having interconnected control signal lines. The control signal lines are interconnected so that a control signal placing the memory circuit in the lower power consumption state provided on the control signal line, takes longer than one period of a clock signal at a nominal rate to settle. The memory circuit also includes a clock input for receiving a clock signal at the nominal rate that is periodically suppressed to allow the control signal to be unambiguously sampled.

Other aspects and features of the present invention will become apparent to those of ordinary skill in the art upon review of the following description of specific embodiments of the invention in conjunction with the accompanying figures.

BRIEF DESCRIPTION OF THE DRAWINGS

In the figures which illustrate by way of example only, embodiments of the present invention, FIG. 1, 1A-1B is schematic diagram of a conventional controller interconnected with multiple ranks of synchronous memory;

FIG. 3, 3A-3B is a schematic diagram of a synchronous circuit including a controller interconnected with multiple ranks of memory, exemplary of an embodiment of the present invention;

DETAILED DESCRIPTION

A typical example of high speed synchronous multi-module circuit is a synchronous dynamic random access memory (SDRAM) circuit. SDRAM is used in many computing devices such as portable (laptop) computers, desktops and workstations. SDRAM typically allows for data transfer at speeds in excess of conventional DRAM or static random access memory.

Figure 1A:
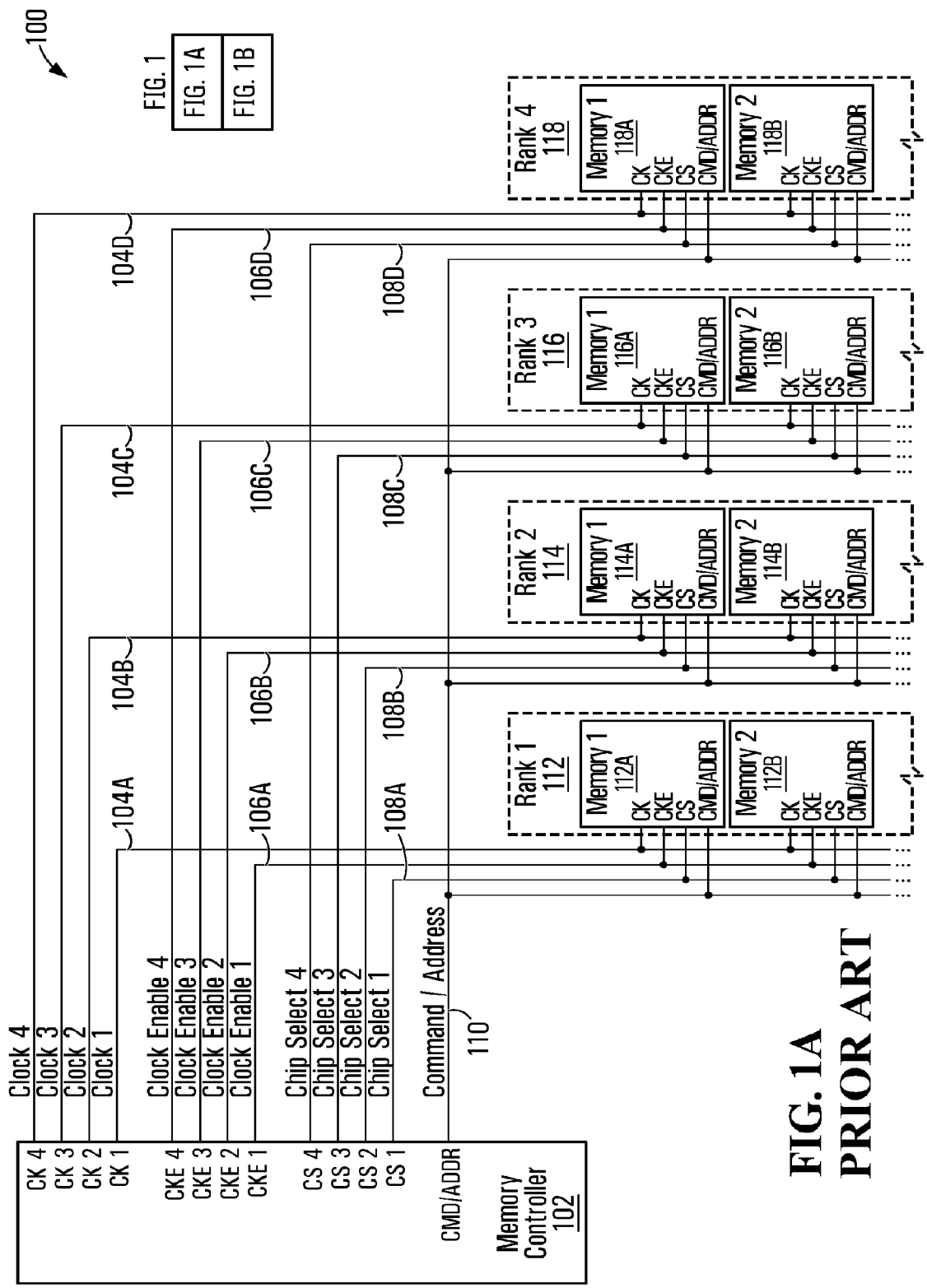
Figure 1B:
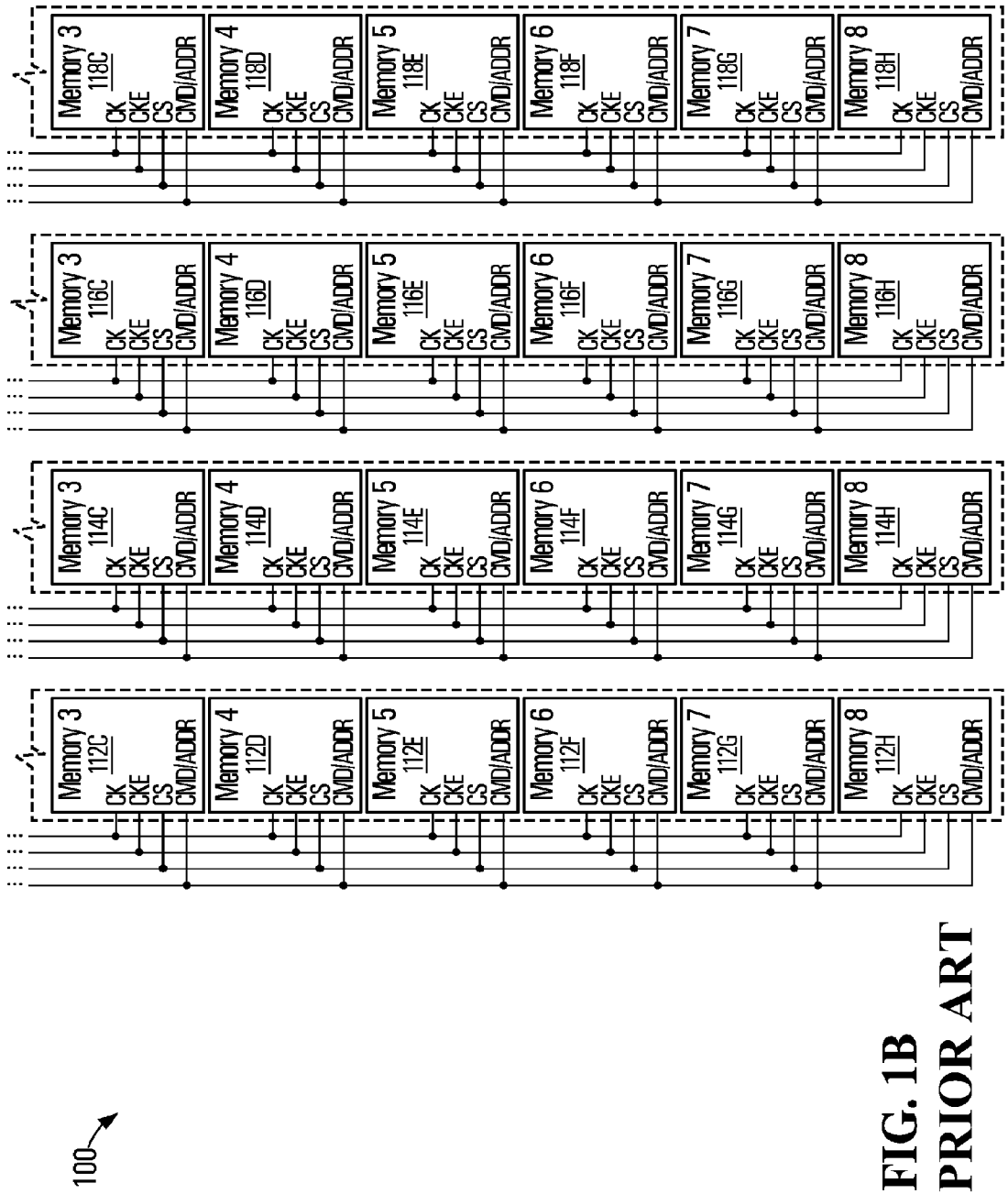

A schematic diagram of a conventional SDRAM circuit 100 is illustrated in FIG. 1. Circuit 100 includes a memory controller 102, and memory ranks 112, 114, 116, and 118. Each memory rank in turn includes a number of memory cells. For example, memory rank 112 includes cells 112A, 112B, 112C, 112D, 112E, 112F, 112G, 112H. Memory rank 114 includes cells 114A, 114B, 114C, 114D, 114E, 114F, 114G, 114H. Memory rank 116 includes cells 116A, 116B, 116C, 116D, 116E, 116F, 116G, 116H. Memory rank 118 includes cells 118A, 118B, 118C, 118D, 118E, 118F, 118G, 118H.

Command/address lines 110 interconnect memory controller 102 to memory ranks 112, 114, 116, 118. Signal lines 104A, 106A, and 108A, interconnect memory controller 102 to memory rank 112. Signal lines 104B, 106B, and 108B interconnect memory controller 102 to memory rank 114. Signal lines 104C, 106C, and 108C interconnect memory controller 102 to memory rank 116. Signal lines 104D, 106D, and 108D interconnect memory controller 102 to memory rank 118. Clock signal lines 104A, 104B, 104C, 104D supply memory clock input to memory ranks 112, 114, 116, 118.

Clock enable lines 106A, 106B, 106C, 106D (individually and collectively enable lines 106) are used to send a clock enable (CKE) signal to memory ranks 112, 114, 116, and 118 respectively. Each clock enable signal in combination with other signals, present control signals to ranks 112, 114, 116, and 118 that control the power consumption state of memory ranks, as detailed below.

Signals on lines 108A, 108B, 108C, 108D are chip-select (CS#) signals used to select one of individual memory ranks 112, 114, 116 or 118 as a target of a command. A convention is adopted whereby signals post-fixed with '#', such as chip-select signal (CS#), are said to be active-low. Active-low signals are held high when de-asserted but driven low when asserted. Conversely, active-high signals, such as clock-enable (CKE) signals are held low when de-asserted, and driven high when asserted.

For controller 102, memory ranks 112, 114, 116 or 118 are electrical loads. Controller 102 drives signals across signal lines 104, 106, 108, 110 to each of memory ranks 112, 114, 116 or 118. A signal line interconnected to just one load such as clock signal line 104 or clock-enable signal line 108 can typically meet 1T timing, as the capacitive load of a single memory rank is relatively small. However signals driven onto signal lines connected to multiple loads such as command/address lines 110 may be slow settling signals and thus may need more than one clock cycle to settle. Delay locked loop (DLL) circuits may often be used to compensate for any delay in the clock signal reaching the target load or memory rank.

Typically, memory circuit 100 may enter one or more lower power consumption states to conserve power. Power conservation is especially important in portable computing devices that are powered primarily by batteries. Entry into a lower power consumption state may be initiated in a variety of circumstances such as, for example, inactivity for a period of time, or by user indication via a software or hardware based input of the computing device, or otherwise. An appropriate signal to transition states of circuit 100 may, for example, be provided to controller 102.

A lower power state may be a 'power down' state, in which most of circuit 100 is shut down, while controller 102 periodically refreshes cells in ranks 112, 114, 116, 118. Alternately, in a 'self refresh' state, an internal circuit (not shown) in each memory rank may refresh the memory cells thereby allowing the controller 102 to shut down logic associated with refreshing memory cells. A 'self-refresh' state conserves even more power than 'power down' state, often at the expense of latency when bringing circuit 100 out of lower power consumption state. Entry into each of the states, 'self refresh' and 'power down' is signaled using control signals. In the depicted embodiment, the control signals are provided by multiple concurrent signals, including the CKE signal on lines 106, provided by controller 102.

Figure 2:
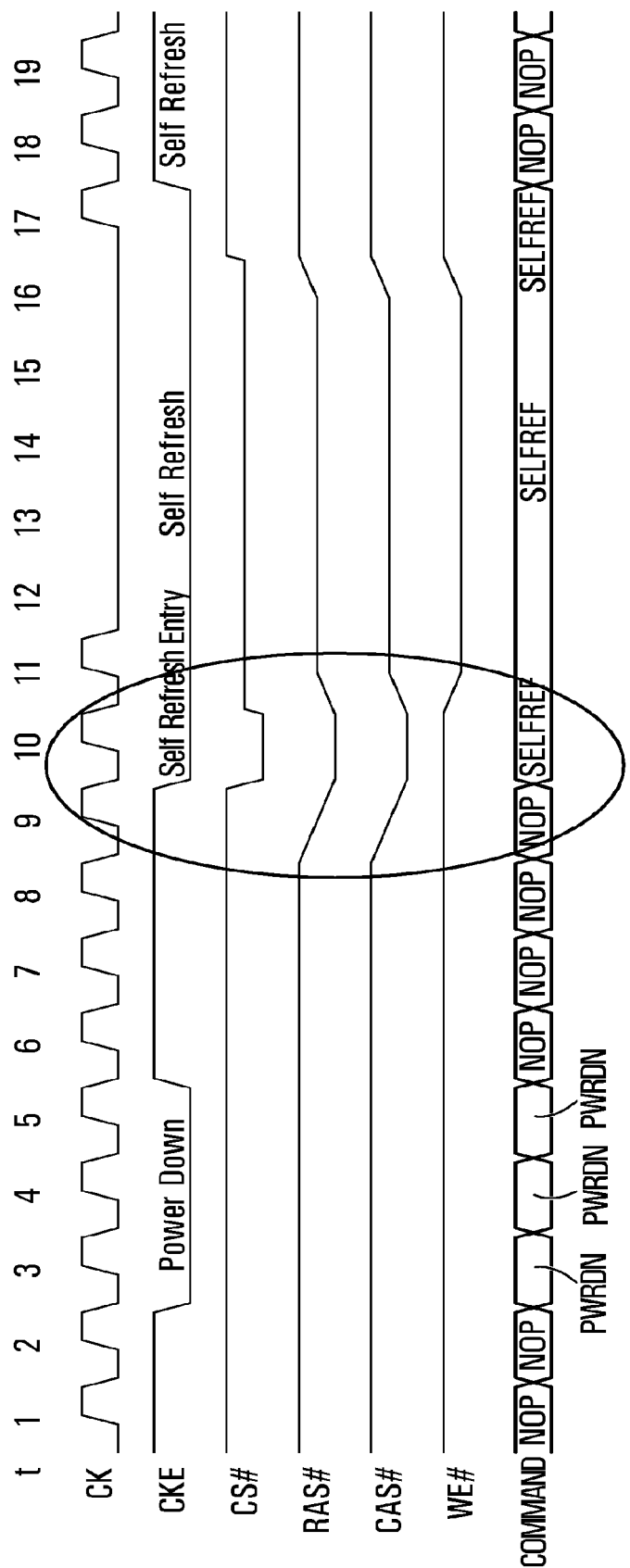
FIG. 2 is a timing diagram of the circuit depicted in FIG. 1, illustrating signal levels on selected signal lines interconnecting the controller to one of the memory ranks.

Specifically, the timing diagram observed when SDRAM circuit 100 enters a lower power state is depicted in FIG. 2. COMMAND displays the meaning of a control signal resulting from the signal levels of individual signals CKE, RAS#, CAS#, WE# and CS#. RAS#, CAS# and WE# signals may be provided using command/address lines 110. In general when both the CS# signal on line 108A and the CKE signal on line 106A are high, the resulting COMMAND is no-operation (NOP). To place memory rank 112 into a 'power down' state, memory controller 102 provides a control signal by driving CKE signal on line 106A low (0) and maintaining the CS# signal on line 108A high (1) as shown in FIG. 2. Alternately, 'power down' state may be entered by driving CKE low, while CS# is low, and RAS#, CAS# and WE# signals are high. To exit a 'power down' state, a control signal is provided by driving CKE high (logic 1), while CS# on line 108A is high. Since both CKE and CS# are high, COMMAND is NOP (as opposed to control signal 'power down').

To place memory rank 112 in a 'self refresh' state, a NOP command in a given cycle with CKE set to high, may be followed by an 'auto refresh' command in a subsequent cycle with CKE set to low. To send a NOP command, CS# may be driven high or alternately CS# low, RAS# high, CAS# high, and WE# high. An 'auto refresh' command is provided by driving CS# low, RAS# low, CAS# low and WE# high. When initiating entry into 'self refresh' state, memory rank 112 should not be in a 'power down' state—that is if rank 112 in a 'power down' state it first exits that state before attempting enter a 'self refresh' state.

Typically multiple ranks such as ranks 112, 114, 116, 118 are placed in a lower power state together. However, as can be appreciated the CKE signal (on any one of lines 106A, 106B, 106C, 106D) as part of each control signal must meet 1T timing (settle on the next rising edge of the clock after being driven as seen in FIG. 2) for the corresponding memory rank to unambiguously detect and assume the 'self refresh' state. Consequently, each of lines 106A, 106B, 106C, 106D is typically connected to only 'one' load or rank (usually formed of 4 or 8 memory cells) thereby ensuring a CKE signal on one of these lines meets 1T timing.

As noted above, routing multiple lines corresponding to each rank requires circuit real estate, creates signal routing complexity, requires additional drivers and may require additional pins for the controller, thereby increasing cost and complexity of manufacturing.

Figure 3A:
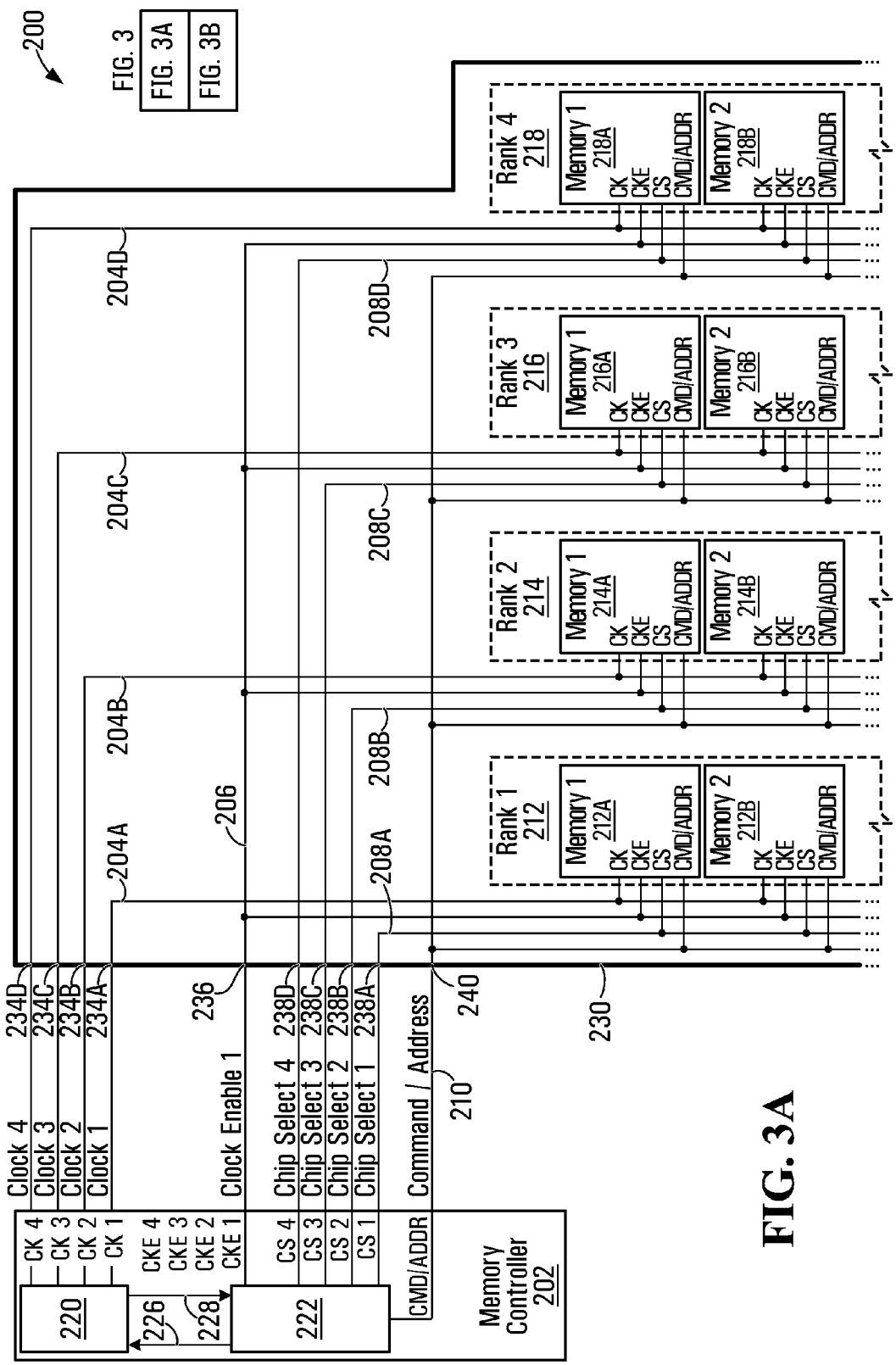
Figure 3B:
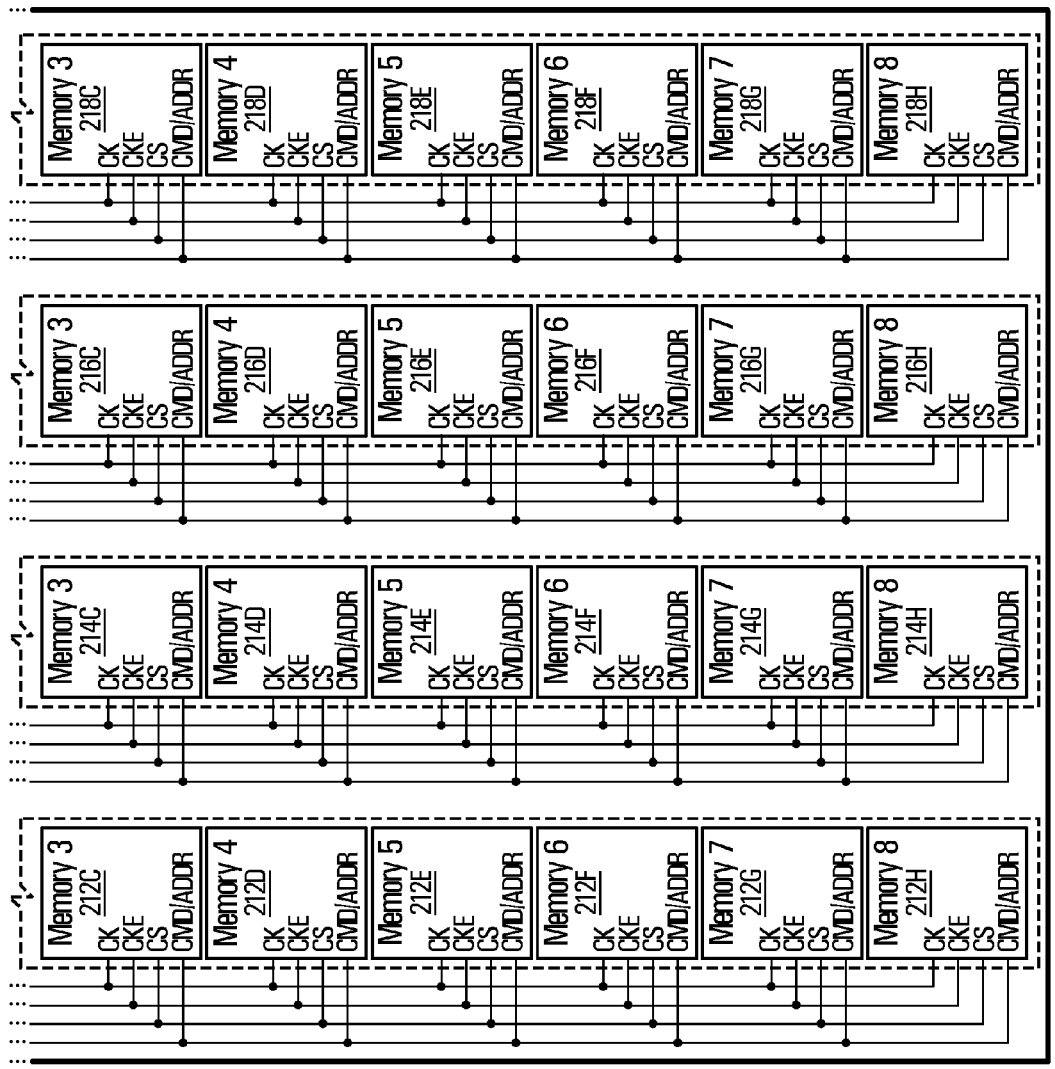

Accordingly FIG. 3 schematically illustrates synchronous circuit 200, exemplary of an embodiment of the present invention. Circuit 200 includes a memory controller 202, and a synchronous digital circuit 230 including memory ranks 212, 214, 216, and 218. Synchronous digital circuit 230 has clock inputs 234A, 234B, 234C, 234D (individually and collectively 234), and control signal inputs 236, 238A, 238B, 238C, 238D, 240. Each memory rank includes a number of memory cells. Memory rank 212 includes cells 212A, 212B, 212C, 212D, 212E, 212F, 212G, 212H. Memory rank 214 includes cells 214A, 214B, 214C, 214D, 214E, 214F, 214G, 214H. Memory rank 216 includes cells 216A, 216B, 216C, 216D, 216E, 216F, 216G, 216H. Memory rank 218 includes cells 218A, 218B, 218C, 218D, 218E, 218F, 218G, 218H.

Signal lines 204A, 204B, 204C, 204D, interconnect memory controller 202 to clock inputs 234A, 234B, 234C, 234D which further interconnect memory ranks 212, 214, 216, 218 respectively. Chip-select (CS#) signal lines 208A, 208B, 208C, 208D, interconnect memory controller 202 to control signal inputs 238A, 238B, 238C, 238D (individually and collectively 238) which further interconnect memory ranks 212, 214, 216, 218. Again, chip-select (CS#) signal lines 208A, 208B, 208C, 208D may be used to carry identification signals to select one or more of individual memory ranks 212, 214, 216 or 218 as targets of a signal on one or more of the signal lines. Clock signal lines 204A, 204B, 204C, 204D supply memory clock to memory ranks 212, 214, 216, 218.

In circuit 200 a shared line 206, interconnected to memory ranks 212, 214, 216 and 218, is used to carry clock-enable (CKE) signal. This is in sharp contrast to circuit 100 of FIG. 1 in which individual clock-enable lines 106A, 106B, 106C, 106D are used. Lines 106A, 106B, 106C, 106D are thus now replaced by line 206 in FIG. 3. In addition, memory controller 202 includes a clock generator 220 to generate clock signals for lines 204A, 204B, 204C and 204D (individually and collectively clock signals 204). Clock generator 220 is in communication with control signal generator 222 used to generate control signals to control state changes, such as the power consumption state of circuit 200. Signal generator 222 may provide multiple control signals to two or more of control signal inputs as multiple concurrent signals using multiple lines 204, 206, 238, 210 including the CKE signal to control input 236 on line 206.

Exemplary of an embodiment of the present invention, control signal generator 222 causes clock generator 220 to suppress clock signal(s) 204 as a control signal is asserted, for a defined duration. Control signal generator 222 interconnects signal inputs 226, 228 of clock generator 220. As will become apparent, signals at inputs 226, 228 may be used to control the generation of clock signals on lines 204A, 204B, 204C, and 204D. Control signal generator 222 also generates CKE, CS#, RAS#, CAS#, and WE# signals to provide a control signal. RAS#, CAS# and WE# signals may be provided using command/address lines 210. Thus, control signal generator 222 may coordinate signals provided to clock generator 220 with control signals provided to memory ranks 212, 214, 216 or 218. The CKE control signal for example, may be a slow settling signal. That is CKE may take more than one clock cycle to settle. By selectively setting the signal level at inputs 226 and 228, a clock signal on any one of lines 204A, 204B, 204C, and 204D may be suppressed. The clock signal is suppressed for at least as long as it takes the control signal to settle. This suppression thus prevents sampling of the control signal before it has settled.

Figure 4:
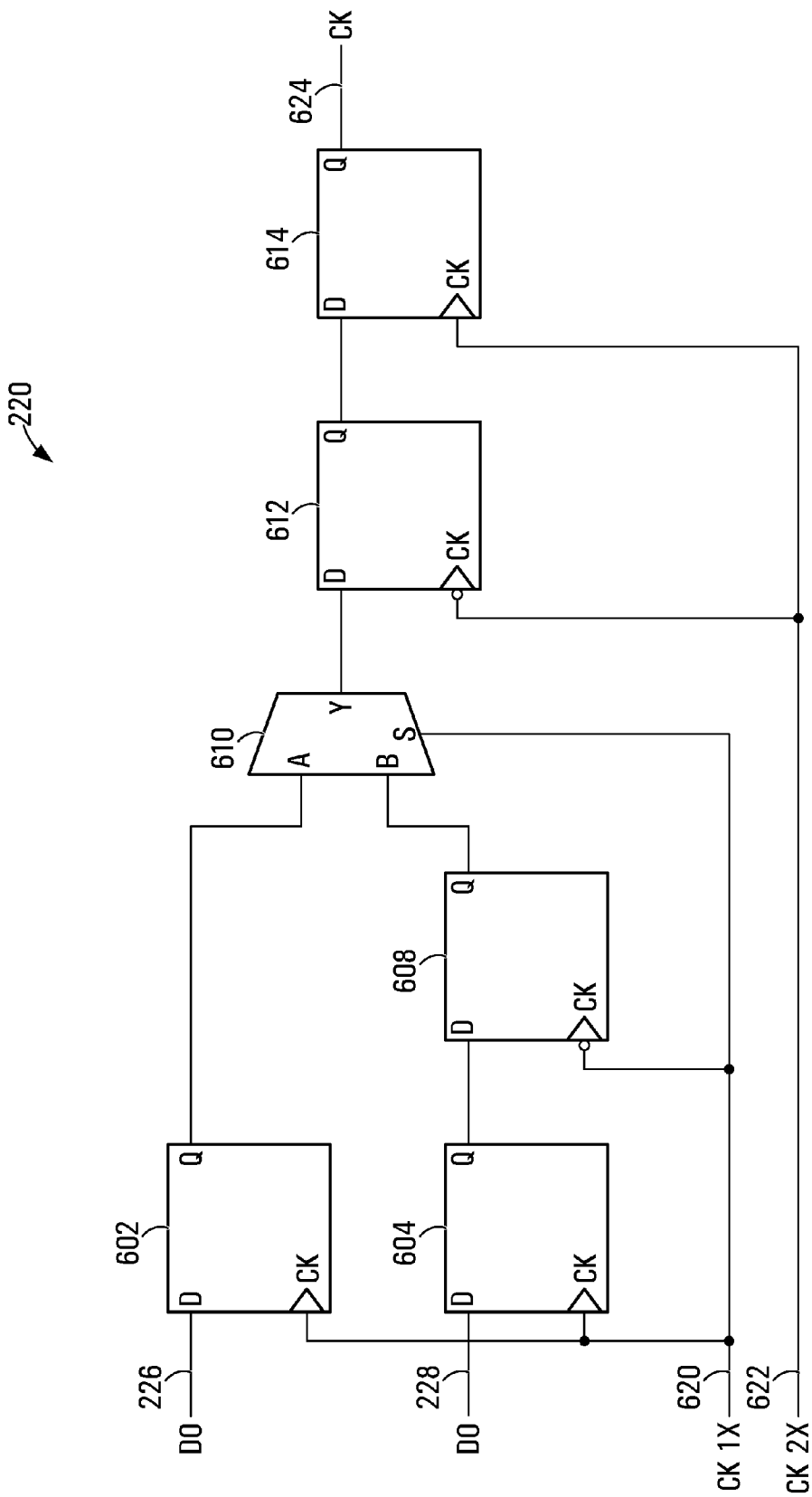
FIG. 4 is a schematic diagram of the clock generation circuit for the circuit in FIG. 3, exemplary of an embodiment of the present invention.

FIG. 4 accordingly illustrates a clock generator 220, exemplary of an embodiment of the present invention, forming part of memory controller 202 in FIG. 3. Clock generator 220 includes flip flops 602, 604, 608, 612, 614, multiplexer 610, and external clock inputs 620, 622, signal inputs 226 and 228. The output of circuit 220 is output 624 interconnected to flip-flop 614. The output of flip-flop 602 is interconnected to one input of multiplexer 610. The output of flip-flop 604 is interconnected to the input of flip-flop 608. The output of flip-flop 608 is fed a second input of multiplexer 610. The output of multiplexer 610 is interconnected to an input of flip-flop 612.

Two clock signals are supplied at clock inputs 620, 622, from an external clock source (not shown). The clock signals may be generated from conventional crystal oscillator based clock sources. The clock signal at input 622 denoted CK-2$x$ has twice the frequency (or half the period) of the clock signal at input 620, denoted CK-1$x$. Flip-flop 614 is clocked using CK-2$x$. Input 620 is interconnected to flip-flops 602, flip-flops 604 and an inverter interconnected to a clock input of flip-flop 608. Input 622 is interconnected to flip-flop 614, and an inverter interconnected to a clock input of flip-flop 612. Output 624 is a clock signal to be fed to memory ranks 212, 214, 216, or 218 interconnected to memory controller 202 using lines 204A, 204B, 204C or 204D (FIG. 3) respectively. Circuit 220 allows control of the signal on output 624, so that the clock signal can be held high or low for one or more cycles, to skip a clock pulse as desired. This is illustrated in the timing diagram of FIG. 5. CK-1$x$ may have a frequency range of 200 MHz-400 MHz (or a period of 2.5-5 ns) while CK-2$x$ may have a frequency of 400 MHz-800 MHz (a period of 1.25-2.5 ns). Faster circuits may use CK-1$x$ in the 400 MHz-800 MHz (a period of 1.25-2.5 ns) range and CK-2$x$ in 800 MHz-1600 MHz (with a period of 0.625-1.25 ns) range.

Figure 5:
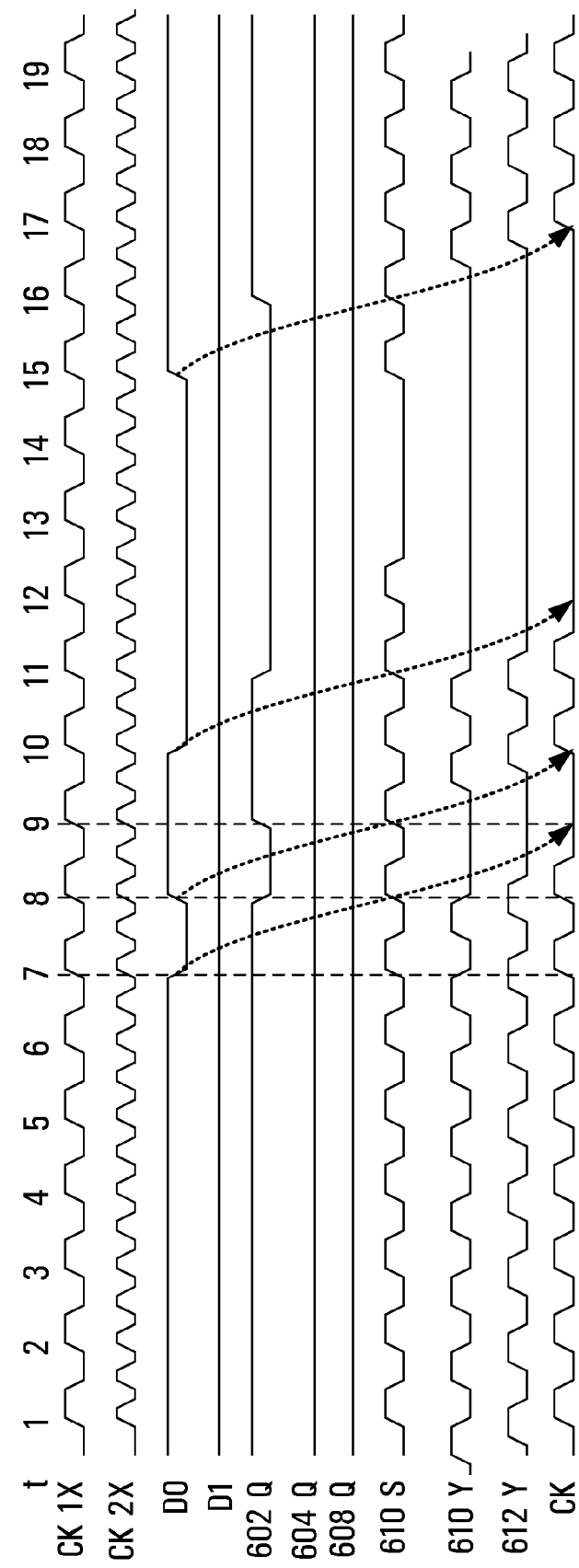
FIG. 5 is a timing diagram illustrating the timing relationships between signal levels on signal lines in the clock generation circuit of FIG. 4.

FIG. 5 is a timing diagram illustrating the timing relationships between signal levels on signal lines in clock generation circuit 220. The marking labels atop the figure represent time instances denoted by t=1, t=2 . . . etc. The input clocks CK-1$x$ and CK-2$x$, are free running clock signals to inputs 620, 620 respectively. To generate a normal free running clock at a nominal rate equal to the rate of CK-1$x$, signal D0 at input 226 of flip-flop 602 is held high while signal D1 at input 228 of flip-flop 604 is held low. This is for example illustrated in periods form t=0 to t=8. To suppress a positive pulse of the output clock CK at t=9, D0 is driven low for one cycle (e.g. t=7 to t=8) while D1 is maintained low, and thus after a delay (of two clock cycles), one clock pulse is suppressed in output clock CK at output 624 (from t=9 to t=10) as shown in FIG. 5. Circuit 220 may thus suppress the clock signal provided to memory ranks, as desired.

Now, as noted above, in circuits such as DDR SDRAM circuits with high clock rates, signals are required to settle before a predetermined time with respect to the clock edge used by receiver (e.g. a memory rank), so that they can be reliably sampled. Some control signals such as CKE on line 206 (FIG. 3) may be required to meet 1T timing, while other signals such as RAS#, CAS# may be in either in 1T or 2T or 3T timing. As can be appreciated, when multiple loads (memory ranks 212, 214, 216, 218) are interconnected using a shared line 206 as shown in FIG. 3, memory controller 202 may not be able to drive the signal on line 206 fast enough to meet 1T timing as required, to allow circuit 200 to enter a lower power consumption state. As a consequence, the required control signal for entering 'power down' state or 'self refresh' state for circuit 100 as depicted in FIG. 2 may not be detected for circuit 200. Due to various factors such as trace characteristic impedance, and memory capacitive load, CKE signal on line 206 has a longer rise-time (i.e. the time it takes for a voltage to rise from 10% to 90% of its peak value, or cross respective thresholds) and fall-time (i.e. the time it takes for a voltage to fall from 90% to 10% of its peak value, or cross respective thresholds) and therefore may not meet 1T timing. That is, CKE signal on line 206 may take longer than one clock cycle of clock signal 204 to settle. The peak value is a signal level that represents high (or logic 1) and may be approximately 1.8V, 2.5V, 3.3V, 5V or another voltage depending on the technology used to implement circuit 200.

Figure 6:
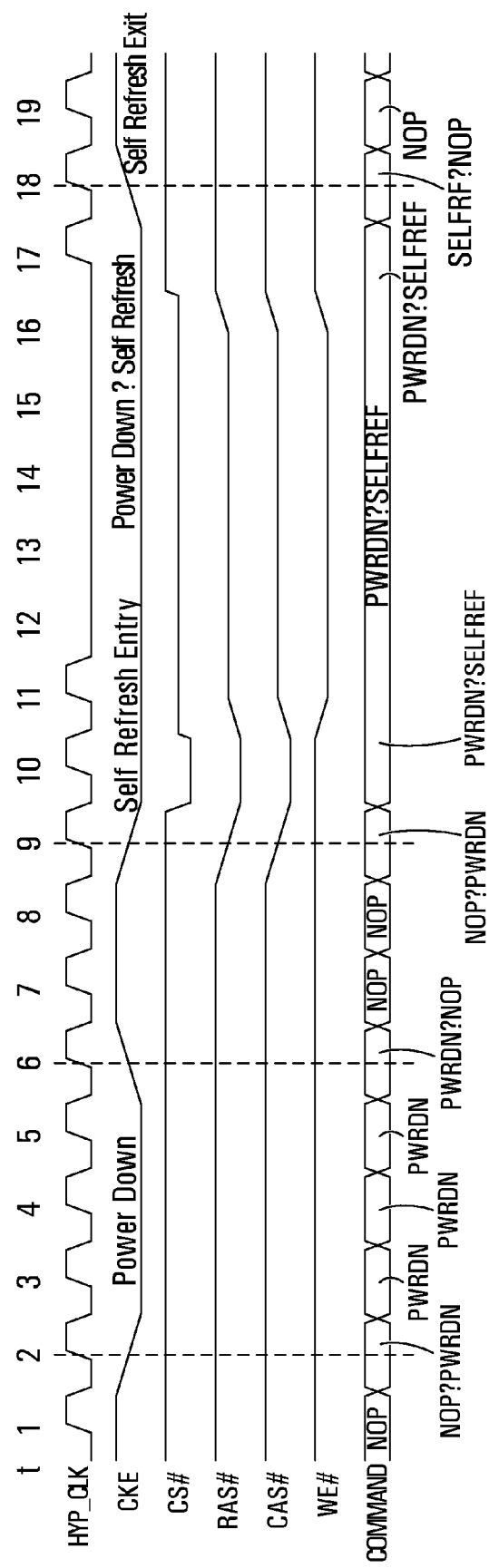
FIG. 6 is a timing diagram illustrating the timing relationships between signal levels on signal lines in the clock generation circuit of FIG. 4, in the presence of a conventional clock signal.

This is best illustrated in FIG. 6 that depicts a timing diagram for CKE, CS#, RAS#, CAS#, WE# signals observed for memory rank 212 of circuit 200. Again, COMMAND displays the meaning of a control signal resulting from the signal levels (low or high) of individual signals CKE, CS#, RAS#, CAS#, WE#. A hypothetical free running clock signal (HYP_CLK) is also illustrated for purposes of explanation only. As can be seen from FIG. 6, the CKE signal does not meet 1T timing. Thus, although the CKE signal is driven low by memory controller 202 before t=2, it does not settle until t=3. Thus the signal level of the CKE signal on line 206 is uncertain at t=2. Similarly the CKE signal is driven high well before the rising edge at t=6, but does not settle until t=7 and thus the signal level of the CKE signal on line 206 is uncertain in at t=6. The uncertainty (in signal level of line 206) causes delay in the control signal and may thus delay or prevent entry into and/or exit out of lower power consumption states. At t=2 and t=6, the control signal (i.e., COMMAND) is uncertain although at t=3 and t=4, COMMAND is 'power down'. However, from t=9 to t=18, the uncertainty in COMMAND may prevent memory rank 212 from entering 'self refresh' state entirely.

In particular, entry into a 'self refresh' state may never occur as expected if the signal level of line 206 is uncertain. As shown in FIG. 6, at time t=9, the signal level of CKE on line 206 is uncertain. Self refresh entry (at t=10) requires that at t=9 CKE is high and a NOP command (CS# high or CS# low with RAS#/CAS#/WE# high), and at t=10, CKE to be low with 'auto refresh' command (that is, CS# low, RAS# low and CAS# low and WE# high). If the CKE signal level on line 206 is interpreted as low at t=9, a 'power down' state is entered, and self refresh entry will be missed, at t=10. Thus, 'self refresh' state will not be entered. A 'self refresh' state is thus entered at t=10 only if the signal level of the CKE signal on line 206 is interpreted as high in preceding cycle (preceding self refresh entry cycle or at t=9) and as low in self refresh entry cycle (at t=10).

It is therefore desirable to remedy this uncertainty. To that end, circuit 200 exemplary of an embodiment of the present invention, is operable to 'skip' a clock pulse by transmitting a predetermined signal level (e.g. 'low' associated logic 0) instead of an expected clock edge while the control signal (including the CKE signal on line 206) is in transition over a multiple clock cycle period.

More specifically, referring again to FIG. 4, signals D0 and D1 (at inputs 226 and 228) are interleaved at the clock rate of the input signal on line 622 (CK-2$x$), to generate an output signal (CK) at output 624 of flip-flop 614. In other words, interleaving D0 with D1 (with signal levels high and low respectively) at CK-2$x$ generates one clock cycle of output clock CK at output 624. Signal (CK) at output 624 thus alternates between the signal levels of D0 (high) at input 226 and D1 (low) at input 228 and behaves as a free running clock. Circuit 220 can thus suppress (or skip) some cycles. If D0 and D1 at inputs 226 and 228 respectively, have the same signal level, when multiplexed or interleaved, the expected alternation between high and low of the output clock CK at output 624 would not be observed. To obtain the regular alternation of the signal level of CK at output 624 between high and low, D0 and D1 may be constantly maintained at high and low signal levels, by control signal generator 222.

As shown in FIG. 5, when D0 and D1 (at inputs 226 and 228) are held high and low respectively, CK at output 624 behaves like a free running clock. However, when the signal level of D0 at input 226 is driven low at t=7, the expected (from a free running clock) rising edge of CK at output 624 at t=9 is not observed. Thus signals that would have been sampled at t=9 using a free running clock, would not be sampled when clock signal CK at output 624 is used. Thus circuit 220 effectively skips a clock cycle whose rising edge is expected at t=9. Similarly when D0 in driven high at t=9, the output clock CK at output 624 resumes its behavior of a free running clock, at t=10. Similarly when D0 is pulled low for 5 clock periods from t=10 to t=15, output clock CK at output 624 is suppressed (held low) for 5 clock periods from t=12 to t=17 as shown in FIG. 5. Thus by simply pulling D0 low for the required duration, circuit 220 may be used to skip as many cycles as needed. The suppression of the clock signal prevents the control signal from being sampled. For a longer duration of clock suppression, input clocks CK-1x, and CK-2x may be stopped completely for some portion of the duration, to conserve power.

Control signal generator 222 thus selectively sets the signal levels at inputs 226 and 228 to cause clock generator 220 to suppress a clock signal on any one of lines 204A, 204B, 204C, and 204D. In particular, control signal generator 222 signals clock generator 220 to suppress the corresponding clock signal (e.g. clock signal on line 204A) prior to providing a control signal that signals memory ranks (e.g. memory rank 212), to enter a lower power consumption state. Since the depicted embodiment of clock generator 220 takes two cycles to suppress the output clock CK, after the signal at input 226 (i.e., D0) is driven low (FIG. 5), control signal generator 222 may drive the signal at input 226, 228 low, two clock cycles prior to signaling memory rank 212 to enter lower power consumption state. A person of ordinary skill in the art would readily understand that other embodiments may use a different delay, between initiating clock suppression and actual signaling of memory rank 212.

Figure 7:
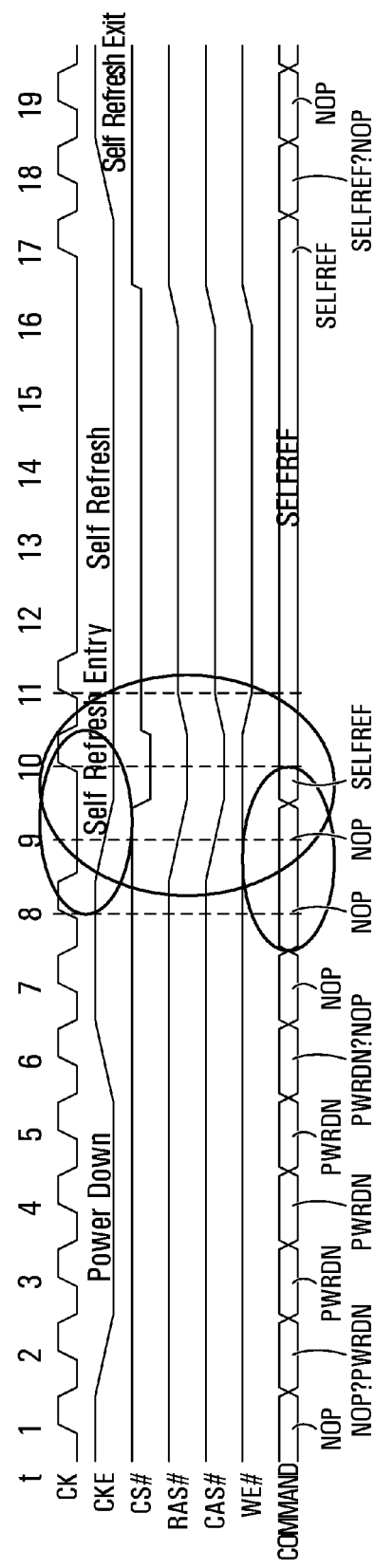
FIG. 7 is a timing diagram illustrating the timing relationships between signal levels on signal lines in the clock generation circuit of FIG. 4, in the presence of a clock signal, exemplary of an embodiment of the present invention.

The resulting behavior of exemplary circuit 200 incorporating clock generator 220, and control signal generator 222 exemplary of an embodiment of the present invention is depicted in the timing diagrams of FIG. 7. Output 624 (FIG. 4) is interconnected to the clock line 208A (FIG. 3) carrying signal CK depicted in FIG. 7. As noted above, when D0 in control signal generator 222 is set low, while D1 is also low, the output clock CK is suppressed two cycles later. Thus, control signal generator 222 drives D0 low at t=7 to suppress the clock CK at t=9. Control signal generator 222 also sets CKE, RAS#, and CAS# to low (prior to t=9), and CS# to low (prior to t=10) in order to enter a 'self refresh' state at t=10. At t=9, none of the signals CKE, RAS#, CAS#, WE# and CS# are sampled as the clock is suppressed. However at t=10, the signals CKE, RAS#, CAS#, WE# and CS# all satisfy the requirement for proper 'self refresh' state entry and the circuit is in 'self refresh'. There are now no ambiguities in the control signal (COMMAND) at t=9, in contrast to FIG. 6. Here a clock signal is suppressed around t=9. In particular the rising edge expected of a free running clock at time t=9 is not observed. COMMAND, and thus the state is maintained as it was at t=8 (the last valid rising edge). COMMAND remains NOP at t=9 as the uncertainty of CKE at t=9 is not sampled. At t=10, CKE is settled to a signal level of low, and the control signal and state of the circuit transitions predictably to 'self refresh'. By suppressing the clock at time t=9, after driving CKE low sometime between t=8 and t=9, circuit 200 (or clock generator 220 in particular), avoids the ambiguity in the state of the circuit (that was observed in duration t=9 to t=17 in FIG. 6). Circuit 230 (or any of memory ranks 212, 114, 216, 218) thus avoids the ambiguity of the CKE signal at t=9, and unambiguously samples the CKE signal at t=10. In FIG. 7, the state is unambiguous for clock cycles between t=9 to t=17, even though the signal at line 206 of FIG. 3 (CKE) still takes two cycles to settle (i.e., only meets 2T timing).

As will now be appreciated, the reduction of signal interconnections also helps minimize the area and thus minimizes the manufacturing cost of the IC. If memory controller is implemented as a discrete component, then the associated I/O pin count may also be correspondingly reduced.

As will also be appreciated, the above noted controller 220 has been described with reference to SDRAM. However, a person of ordinary skill will readily appreciate that the invention may be used in other controllers that provide a clock used to sample a control signal, provided in one or more clock cycles, on one or more signal lines, at least one of which does not settle within a clock cycle.

Of course, the above described embodiments are intended to be illustrative only and in no way limiting. The described embodiments of carrying out the invention, are susceptible to many modifications of form, arrangement of parts, details and order of operation. The invention, rather, is intended to encompass all such modification within its scope, as defined by the claims.

What is claimed is:

1. A method of operating a synchronous digital circuit comprising a clock input and at least one control signal input, said digital circuit having a normal state and a lower power consumption state, said method comprising:
   providing a clock signal through said clock input in said normal state, and
   providing a control signal through said at least one control signal input to place said synchronous digital circuit in said lower power consumption state, said control signal taking a duration of time longer than one cycle of said clock signal to settle, and concurrently suppressing said clock signal at said clock input for at least said duration, thereby preventing sampling of said control signal before said control signal has settled.

2. The method of claim 1, wherein said synchronous digital circuit comprises a plurality of memory ranks.

3. The method of claim 2, wherein said memory ranks are SDRAM.

4. The method of claim 3, wherein said memory ranks are DDR SDRAM.

5. The method of claim 2, wherein said synchronous digital circuit comprises a plurality of control signal inputs interconnecting said plurality of memory ranks and said control signal is provided concurrently on multiple lines to said control signal inputs.

6. The method of claim 5, wherein one of said multiple lines comprises a line carrying a clock-enable signal.

7. The method of claim 6 wherein said providing said control signal comprises asserting said clock-enable signal.

8. The method of claim 1 wherein said duration is at least half the period of said clock signal.

9. The method of claim 1, wherein said duration is in excess of one period of said clock signal.

10. A circuit comprising:
    a clock generator for providing a clock signal to a synchronously operated digital circuit;
    a control signal generator for providing a control signal to said synchronously operated digital circuit;
    said control signal generator interconnected to said clock generator to suppress said clock signal for a defined duration as a control signal is provided by said control signal generator, wherein said defined duration allows said control signal to settle to allow said synchronously operated digital circuit to unambiguously sample said control signal.

11. The circuit of claim 10, wherein said control signal generator generates a plurality of individual signals to provide said control signal.

12. The circuit of claim 10, wherein said control signal is provided by way of at least one of a CKE signal, a CS# signal, a RAS# signal, a CAS# signal and a WE# signal.

13. The circuit of claim 10, wherein said clock generator comprises a multiplexer in electrical communication with
   (i) a first clock input for accepting a first external clock signal of period T,
   (ii) a second clock input for accepting a second external clock signal of period T/2,
   (iii) a first signal input accepting a first signal,
   (iv) a second signal input accepting a second signal, and
   (v) an output transmitting said clock signal,
   said multiplexer interleaving said first and second signals at a rate of about 2/T to generate said clock signal at said output, such that for every consecutive duration of length T, said output transmits said first signal for a portion said duration, and said second signal for the remainder of said duration.

14. The circuit of claim 10, wherein and said synchronously operated digital circuit comprises a plurality of memory cells.

15. The circuit of claim 10, wherein and said synchronously operated digital circuit comprises synchronous dynamic random access memory.

16. The circuit of claim 15, wherein and said clock signal provides a memory clock for said synchronous dynamic random access memory.

17. The circuit of claim 16, wherein said control signal provided by said control signal generator places said synchronous dynamic random access memory in a low power consumption mode.

18. A memory circuit, comprising:
   a plurality of ranks of synchronous memory, each of said ranks having a first control signal input and a clock input;
   a controller comprising a control signal generator providing a shared signal to said first control signal inputs of said plurality of ranks, and a clock generator providing a clock to said clock inputs of said plurality of ranks;
   wherein said control signal generator is in communication with said clock generator to suppress said clock for a defined duration as a control signal is provided by said control signal generator, wherein said defined duration allows said control signal to settle to allow each of said plurality of ranks of synchronous memory to unambiguously sample said control signal.

19. A method of operating a synchronous digital circuit comprising a clock input and at least one control signal input, said digital circuit having a normal state and a lower power consumption state, said method comprising:
   receiving a clock signal through said clock input in said normal state,
   receiving a control signal through said at least one control signal input and sampling said control signal using said clock signal, to place said synchronous digital circuit in said lower power consumption state, said control signal taking a duration of time longer than one cycle of said clock signal to settle, and said clock signal at said clock input concurrently suppressed for at least said duration.

20. The method of claim 19 wherein said synchronous digital circuit comprises a memory circuit.

21. The method of claim 20 wherein said memory circuit comprises memory ranks.

22. The method of claim 21 wherein said memory ranks are SDRAM.

23. A memory controller comprising:
   a control signal generator providing a shared signal to a plurality of ranks of synchronous memory, each of said ranks having a first control signal input and a clock input;
   a clock generator providing a clock to said clock inputs of said plurality of ranks;
   wherein said control signal generator is in communication with said clock generator to suppress said clock for a defined duration as a control signal is provided by said control signal generator, wherein said defined duration allows said control signal to settle to allow each of said plurality of ranks of synchronous memory to unambiguously sample said control signal.

24. A memory circuit having a normal state and a lower power consumption state, said memory circuit comprising
   a plurality of ranks of synchronous memory having interconnected control signal lines, interconnected so that a control signal placing said memory circuit in said lower power consumption state provided on said control signal line takes a duration of time longer than one period of a clock signal at a nominal rate to settle,
   a clock input for receiving a clock signal, at said nominal rate that is periodically suppressed to allow said control signal placing said memory circuit in said lower power consumption state to be unambiguously sampled.

* * * * *